United States Patent
Tuovinen

(10) Patent No.: US 8,953,779 B2
(45) Date of Patent: *Feb. 10, 2015

(54) PIEZOELECTRIC USER INTERFACE

(75) Inventor: Juhani Tuovinen, Espoo (FI)

(73) Assignee: Nokia Corporation, Espoo (FI)

( * ) Notice: Subject to any disclaimer, the term of this patent is extended or adjusted under 35 U.S.C. 154(b) by 554 days.

This patent is subject to a terminal disclaimer.

(21) Appl. No.: 12/862,240

(22) Filed: Aug. 24, 2010

(65) Prior Publication Data

US 2010/0315370 A1  Dec. 16, 2010

Related U.S. Application Data

(63) Continuation of application No. 10/496,601, filed as application No. PCT/FI02/00956 on Nov. 27, 2002, now Pat. No. 7,869,589.

(30) Foreign Application Priority Data

Nov. 28, 2001 (FI) .................................... 20012330

(51) Int. Cl.
*H04R 25/00* (2006.01)
*H04B 1/38* (2006.01)
(Continued)

(52) U.S. Cl.
CPC .............. *G06F 3/016* (2013.01); *B06B 1/0215* (2013.01); *G06F 3/0202* (2013.01); *H01H 13/84* (2013.01); *H03K 17/96* (2013.01); *H01H 2215/052* (2013.01); *H03K 2217/96062* (2013.01)
USPC ................... 379/433.07; 345/156; 340/407.1; 455/566

(58) Field of Classification Search
CPC . G06F 3/016; G06F 3/04886; G06F 3/03547; G06F 3/041; G06F 3/0488; G06F 2203/013; G06F 2203/014; G06F 2203/015; H01H 2215/052; H01H 2003/008; H01H 2231/022; H01H 13/702; H01H 2217/032; H01H 2221/002; H01H 2239/006
USPC .......... 379/433.07, 368; 455/575.1, 567, 566, 455/186.2; 345/173, 156; 427/100; 327/517; 235/145 R; 340/407.1, 407.2; 434/262

See application file for complete search history.

(56) References Cited

U.S. PATENT DOCUMENTS 3,935,485 A   1/1976 Yoshida et al.
4,362,911 A   12/1982 Sears et al.
(Continued)

FOREIGN PATENT DOCUMENTS

DE   3301428   9/1983
EP   0278916   2/1988
(Continued)

OTHER PUBLICATIONS

Notice of Allowance dated Apr. 29, 2010 from U.S. Appl. No. 10/496,601, 14 pages.
(Continued)

*Primary Examiner* — Davetta W Goins
*Assistant Examiner* — Phylesha Dabney
(74) *Attorney, Agent, or Firm* — Alston & Bird LLP

(57) ABSTRACT

An apparatus includes a touchscreen keypad and one or more devices that generate a tactile response to a user of the apparatus when a key in the keypad is pressed. In order accomplish a simple construction requiring a minimum of space, the one or more devices that generate that tactile response may include at least one piezoelectric element configured to generate vibration which is forwarded to the user in response to a key of the touchscreen keypad being pressed.

13 Claims, 6 Drawing Sheets

(51) Int. Cl.
*H04B 3/36* (2006.01)
*G06F 3/01* (2006.01)
*B06B 1/02* (2006.01)
*G06F 3/02* (2006.01)
*H01H 13/84* (2006.01)
*H03K 17/96* (2006.01)

(56) References Cited

U.S. PATENT DOCUMENTS

| | | | |
|---|---|---|---|
| 5,275,166 | A | 1/1994 | Vaitekunas et al. |
| 5,311,175 | A | 5/1994 | Waldman |
| 5,374,449 | A * | 12/1994 | Buhlmann et al. ............ 427/100 |
| 5,842,123 | A | 11/1998 | Hamamoto et al. |
| 5,982,304 | A | 11/1999 | Selker et al. |
| 5,982,352 | A | 11/1999 | Pryor |
| 6,252,336 | B1 | 6/2001 | Hall |
| 6,429,846 | B2 * | 8/2002 | Rosenberg et al. ............ 345/156 |
| 6,549,194 | B1 | 4/2003 | McIntyre et al. |
| 6,639,510 | B1 * | 10/2003 | Soulie ........................ 340/407.2 |
| 6,769,313 | B2 | 8/2004 | Weiss |
| 7,113,177 | B2 * | 9/2006 | Franzen ........................ 345/173 |
| 7,391,861 | B2 * | 6/2008 | Levy .............................. 379/368 |
| 7,450,110 | B2 * | 11/2008 | Shahoian et al. ............. 345/173 |
| 2002/0084721 | A1 | 7/2002 | Walczak |
| 2003/0038776 | A1 * | 2/2003 | Rosenberg et al. ........... 345/156 |
| 2005/0253643 | A1 * | 11/2005 | Inokawa et al. ............... 327/517 |
| 2006/0118610 | A1 * | 6/2006 | Pihlaja et al. ............. 235/145 R |
| 2006/0187215 | A1 * | 8/2006 | Rosenberg et al. ........... 345/173 |
| 2006/0192771 | A1 * | 8/2006 | Rosenberg et al. ........... 345/173 |
| 2007/0103449 | A1 * | 5/2007 | Laitinen et al. ............... 345/173 |

FOREIGN PATENT DOCUMENTS

| | | |
|---|---|---|
| EP | 1170765 | 1/2002 |
| GB | 2115352 | 9/1983 |
| JP | 05091041 | 4/1993 |
| JP | 10210120 | 8/1998 |
| JP | 11162277 | 6/1999 |
| JP | 11212725 | 8/1999 |
| JP | 2000267785 | 9/2000 |
| JP | 2001249758 | 9/2001 |
| WO | WO0139226 | 5/2001 |
| WO | WO0154109 | 7/2001 |
| WO | WO0195358 | 12/2001 |

OTHER PUBLICATIONS

Office Action Response dated Jan. 25, 2010 from U.S. Appl. No. 10/496,601, 7 pages.
Office Action dated Aug. 20, 2009 from U.S. Appl. No. 10/496,601, 13 pages.
Pre-Appeal Brief dated Apr. 17, 2009 from U.S. Appl. No. 10/496,601, 4 pages.
Office Action dated Apr. 1, 2009 from U.S. Appl. No. 10/496,601, 3 pages.
Office Action Response dated Mar. 12, 2009 from U.S. Appl. No. 10/496,601, 8 pages.
Office Action dated Jan. 12, 2009 from U.S. Appl. No. 10/496,601, 10 pages.
Office Action Response dated Aug. 4, 2008 from U.S. Appl. No. 10/496,601, 12 pages.
Office Action dated May 7, 2008 from U.S. Appl. No. 10/496,601, 9 pages.
Office Action dated Jun. 24, 2008 from Japanese Application No. 2003548323, 3 pages.
Office Action dated Aug. 17, 2010 from European Application No. 10165999.3, 5 pages.
Office Action dated Jun. 30, 2011 from EP 10165999.3, 3 pages.

* cited by examiner

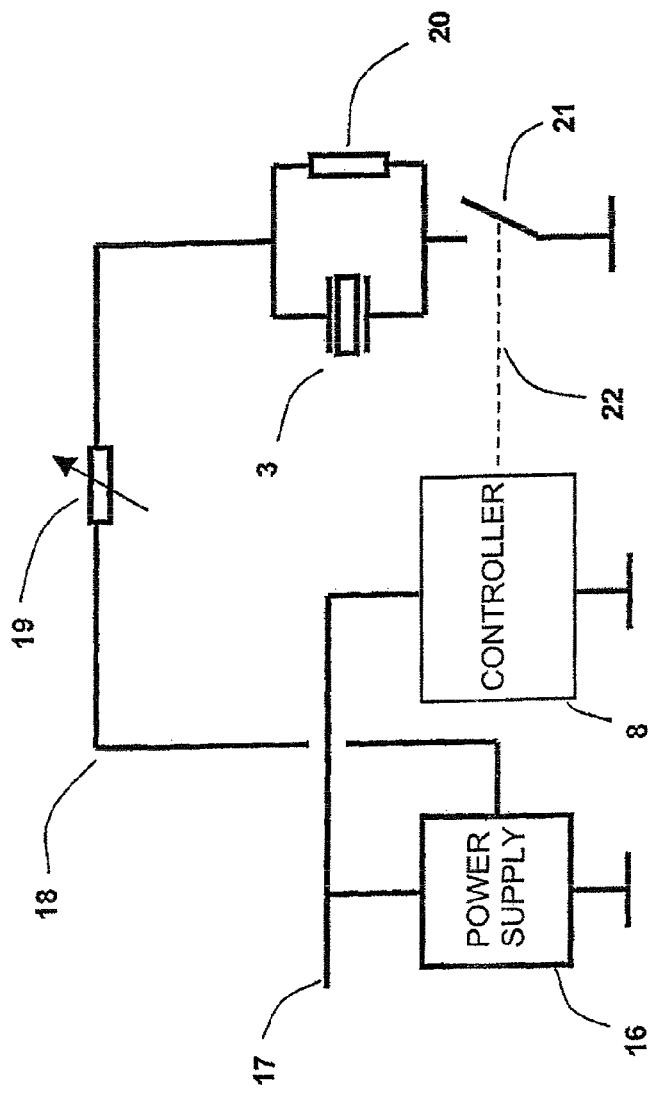
FIG. 5
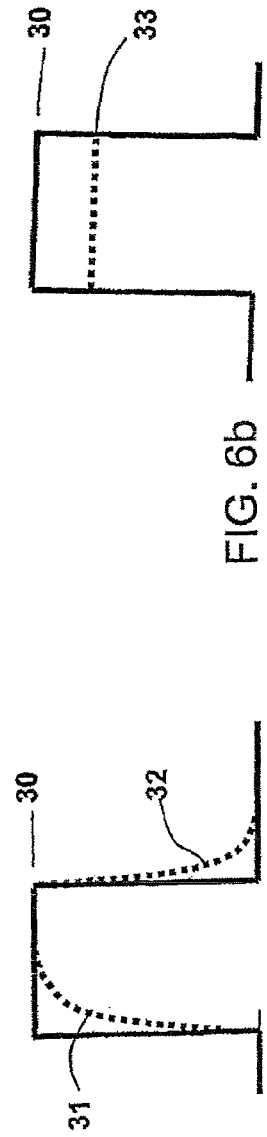
FIG. 6a
FIG. 6b

PIEZOELECTRIC USER INTERFACE

CROSS-REFERENCE TO RELATED APPLICATIONS

This is a continuation application of application Ser. No. 10/496,601, filed May 25, 2004 now U.S. Pat. No. 7,869,589, which is a National Stage of International Application No. PCT/FI02/00956, filed Nov. 27, 2002, which claims priority to Finnish Application No. 20012330, filed Nov. 28, 2001, the contents of which are incorporated herein by reference in their entirety.

FIELD OF THE INVENTION

This invention relates to a solution for generating tactile feedback to a user of an apparatus when the user presses a key on a keypad of the apparatus. Such tactile feedback, which is perceptible by touch, makes it possible for the user to know when the key has been pressed long and hard enough for the apparatus to register the keystroke.

BACKGROUND OF THE INVENTION

Several different solutions are previously there known for indicating to a user of an apparatus that a key has been pressed long and hard enough to enable the keystroke to be registered.

A previously known solution is to provide each key with a mechanism which produces a "click" that can be felt and/or heard by a user when the user presses a key. The problem with such prior art mechanical solutions is the space required by the mechanism. It is in practice necessary to design the key such that the key is allowed to move a predetermined distance before it reaches the location where the "click" is generated. The space required by the movement and the space required by the mechanism itself mean that the entire keypad turns out to be relatively thick.

Another previously known solution is to provide an apparatus with means for generating a sound signal each time a keystroke is registered. Such a solution has typically been used in connection with thin membrane keypads since this solution does not increase the thickness of the keypad because the means necessary for generating the sound can be located somewhere else in the apparatus. The problem with this prior art solution is, however, that the "beep" generated in connection with each keystroke is rather annoying, and most users would thus prefer to turn off such a "beep". This, however, is not possible in practice because then the user will not know when a keystroke has been registered, since this solution does not give any tactile feedback to the user. Thus the user might, by mistake, press the same key several times although the intention was only to press once.

SUMMARY OF THE INVENTION

An object of the present invention is to solve the above-mentioned problems and to provide an apparatus with improved means for generating tactile feedback to a user in connection with a keystroke.

Another object of the present invention is to provide an apparatus with means for generating tactile feedback which requires less space than in the previous solutions.

The above-mentioned and other objects of the invention are achieved by an apparatus that includes a keypad and means for generating a tactile response to a user of the apparatus when a keypad is pressed. The means for generating a tactile response include at least one piezoelectric element arranged to generate vibration which is forwarded to the user via a key when said key is pressed.

The invention is based on the idea of utilizing a piezoelectric element in an apparatus in order to provide the user with tactile feedback in connection with a keystroke. The piezoelectric element is small enough to be integrated such an element into a membrane keypad of an apparatus, for instance. A piezoelectric element can be controlled to create vibration which propagates to the key pressed by a user. The space needed in the prior art solutions for a mechanism to produce a suitable "click" at each keystroke can be significantly minimized by the invention, since the piezoelectric element can create vibration where the key which has been pressed is pushed back in a direction towards a finger of the user.

The most significant advantages of the present invention are that tactile feedback can be generated employing a simpler solution which requires less space than the prior art solutions, the energy consumption in connection with generating tactile feedback is low, and that the price of the means necessary for generating tactile feedback is relatively low.

In a first preferred embodiment the present invention, the apparatus includes a controller arranged to identify a key in said keypad pressed by the user, and to check whether or not the pressed key has been available as an option at that particular moment. If the key has been available as an option, a piezoelectric element is controlled to generate first kind of vibration. If, on the other hand, the key has not been available as an option, a piezoelectric element is controlled to generate second kind of vibration. This embodiment makes it possible to give the user such tactile feedback that the user can immediately feel whether the user has pressed a "right" key or a "wrong" key.

In a second preferred embodiment, the apparatus is a media terminal comprising means for establishing telecommunication connections, and the apparatus is arranged to generate an alerting sound signal with said at least one piezoelectric element in response to an incoming call. This embodiment is advantageous as it makes it possible to save space in the media terminal, since the alerting sound signal can be created with the same piezoelectric element as is used to generate tactile feedback when a key is pressed. This can be achieved when the media terminal is programmed to feed such a signal to the piezoelectric element that the piezoelectric element generates vibration that can be heard.

In a third preferred embodiment, the apparatus is a media terminal comprising means for establishing telecommunication connections, and said apparatus is arranged to generate an alerting vibration signal with said at least one piezoelectric element in response to an incoming call. This embodiment makes it possible to save space by eliminating an extra component used in the prior art media terminals in order to accomplish vibration alerting. Instead, it is possible to generate such vibration alert by using the same piezoelectric element as is used to generate tactile feedback when a key is pressed. In this embodiment, it might be advantageous to have several piezoelectric elements in the media terminal since this makes it possible to generate very strong vibration. The user thus feels the vibration even if the media terminal is located in a pocket.

BRIEF DESCRIPTION OF THE DRAWINGS

In the following, the present invention will be described in closer detail by way of example and with reference to the attached drawings, in which

FIG. 5 shows an electric circuit with a piezoelectric element,

FIGS. 6a and 6b show how a waveform can be varied, and

DESCRIPTION OF THE PREFERRED EMBODIMENTS

Figure 1A:
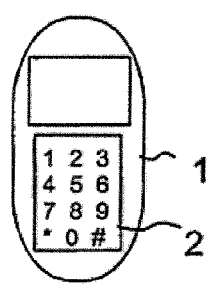
FIG. 1a shows a first preferred embodiment of an apparatus according to the invention.
Figure 1B:
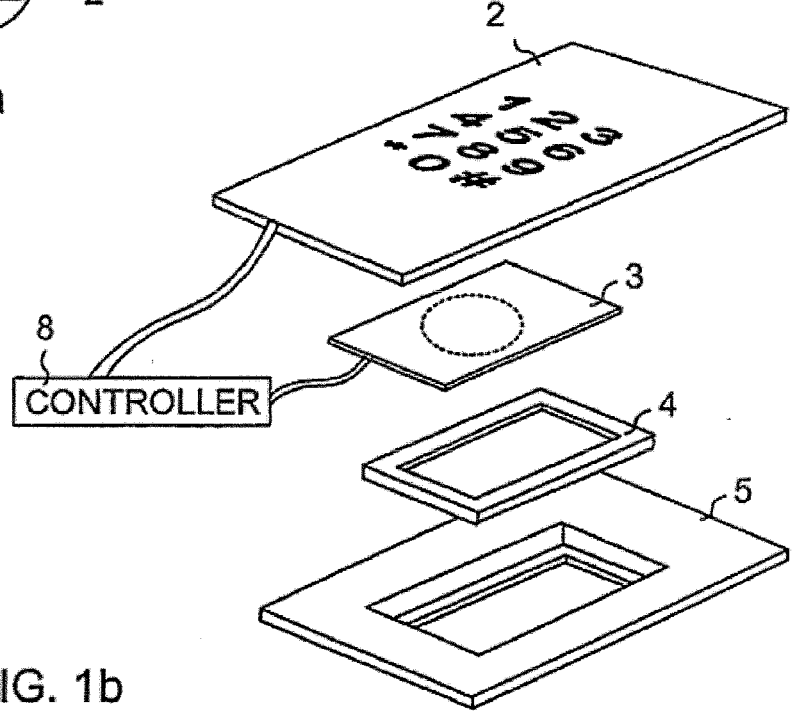
FIG. 1b shows an exploded view of parts associated with the key-pad of the apparatus in FIG. 1a, FIG. 1c shows a sectional view of the parts in FIG. 1b.
Figure 1C:
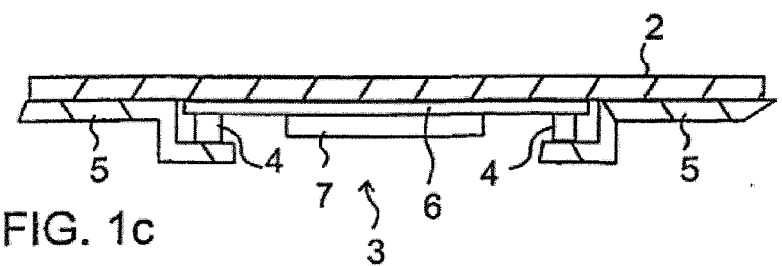

FIGS. 1a to 1c illustrate a first preferred embodiment of the invention. The apparatus 1 in the example of FIGS. 1a to 1c is a media terminal comprising means for establishing telecommunication connections. These means include a radio transmitter and a radio receiver for establishing, for instance, phone calls via a cellular mobile communication system. The mobile communication system may be, for instance, a GSM system (Global System for Mobile communications) or a third generation mobile communication system.

FIG. 1a shows an apparatus comprising a keypad 2 and a display. FIG. 1b shows an exploded view of parts associated with the keypad 2 of the apparatus 1 in FIG. 1a, and FIG. 1c shows a sectional view of the parts in FIG. 1b. The keypad 2 is a flexible membrane keypad which may consist of one layer (as shown in the FIGS. 1b and 1c) or of several cooperating layers. The locations of the keys are visible on an upper side of the keypad 2. When a user presses one of the keys on the keypad 2, an impulse corresponding to the pressed key is generated and forwarded to a controller 8 (which is schematically shown in FIG. 1b).

The apparatus also includes a piezoelectric element 3 arranged to contact a lower side of the keypad 2. The piezoelectric element 3 is, in the example of FIG. 1b, connected to controller 8 such that the controller may control the function of the piezoelectric element. It is naturally also possible to have separate controllers for the keypad and the piezoelectric element.

The piezoelectric element 3 includes a metallic plate 6 to which a piezo transducer 7 has been attached. Many materials, such as quartz, lithium niobate and lead-zirconate-lead-titane (PTZ) exhibit some form of piezoelectric effect and can thus be used in a piezoelectric element.

There are several piezoelectric elements commercially available which can be used in an apparatus according to the present invention. An alternative is to use a piezoelectric element GPB-A-25 0.9E available from Union Enterprise Co., 1326, Life Officetel, 61-3 Yoido-Dong, Yeoungpo-Ku, Seoul, Korea. In this case, the thickness of the piezoelectric element 3 in FIGS. 1b and 1c may be 0.15 mm, and the width and length of the rectangular plate 6 may be 40 mm×50 mm.

The piezoelectric element 3 is supported by a soft foam frame 4 whose back side is supported by a hard layer 5. The hard layer 5 might be a part of the body of the apparatus 1.

When the controller 8 detects that the user has pressed one of the keys on the keypad 2, the controller feeds an electrical impulse to the piezoelectric element 3. This impulse causes the piezoelectric element 3 to vibrate. As the keypad 2 is a flexible membrane keypad whose lower side is in direct contact with the piezoelectric element, the user of the keypad 2 feels the vibration with his finger. The user thus receives tactile feedback informing the user that the key has been pressed hard and long enough in order for the apparatus to register the keystroke.

Suitable vibration can be generated when the voltage of the signal fed to the piezoelectric element is around 150 . . . 200 VDC and a piezo transducer whose diameter is 25 mm is used. The capacitance of the piezoelectric element may in this case be around 60 nF in order to produce vibration which can be felt by the user. If the apparatus is a media terminal, the previously mentioned voltage is not usually available in the media terminal. A way to produce the required voltage is to include a piezoelectric transformer in the apparatus.

Two kinds of piezoelectric effect exist: direct effect and inverse effect. With the direct effect, placing a force or vibration (stress) on the piezoelectric element generates a charge. The inverse piezoelectric effect means that applying a field at the same polarity of the element results in a dimensional increase, and fields of opposite polarity result in a decrease.

A piezoelectric transformer (known from the prior art) uses both the inverse and the direct piezoelectric effect. The inverse effect is used such that a sine-wave voltage is fed to a "first" piezoelectric element. This voltage causes this first piezoelectric element to vibrate. A "second" piezoelectric element is attached to the first element such that the vibration generated by the first piezoelectric element places stress on the second piezoelectric element, thus enabling an output voltage to be obtained at the output of the second piezoelectric element. Suitable dimensioning of the piezoelectric elements enables a desired output voltage to be obtained. Practical implementations exist where a piezoelectric transformer with dimensions of: 20 mm×6 mm×1 mm can be used to obtain an output voltage of 150 V (effect 1 W) when the input voltage is 3V. Such a piezoelectric transformer can be used for instance in a multimedia terminal in order to achieve the voltage required for the piezoelectric element of the present invention.

In an embodiment of the present invention the controller 8 can be programmed to generate different kinds of vibration depending on the situation. A possibility is that the controller 8 is programmed to check, at each keystroke, whether the pressed key has been available as an option at that particular moment. If the key has been available as an option, the controller can control the piezoelectric element 3 to generate first kind of vibration, in other words tactile response, to the user. If, however, the pressed key has not been available as an option, the controller can control the piezoelectric element 3 to generate second kind of vibration. The user, by sensing the second kind of vibration with his finger or by hearing the sound of the second vibration with his ears, then knows that he has pressed the wrong key. If the apparatus 1 is a multimedia terminal that can be used for telecommunication connections, the piezoelectric element 3 (or elements, if the multimedia terminal includes several piezoelectric elements) can be used to generate an alerting vibration signal. The prior art elements used in known mobile phones can thus be eliminated by a much smaller and lighter piezoelectric element. In this case, the controller 8 controls the piezoelectric element (or elements) to generate vibration of a frequency and intensity that can be felt by the user who has the multimedia terminal in his pocket. It is also possible to use the piezoelectric element 3 to generate an alerting sound signal. No extra buzzer is then needed in the multimedia terminal for this purpose.

The same piezoelectric element can easily be used for the above-mentioned different tasks in practice since the only necessary change is to program the controller to feed different kinds of waveforms to the piezoelectric element 3. FIGS. 4*a* to 4*f* show examples of waveforms which can be fed to a piezoelectric element.

Figure 2:
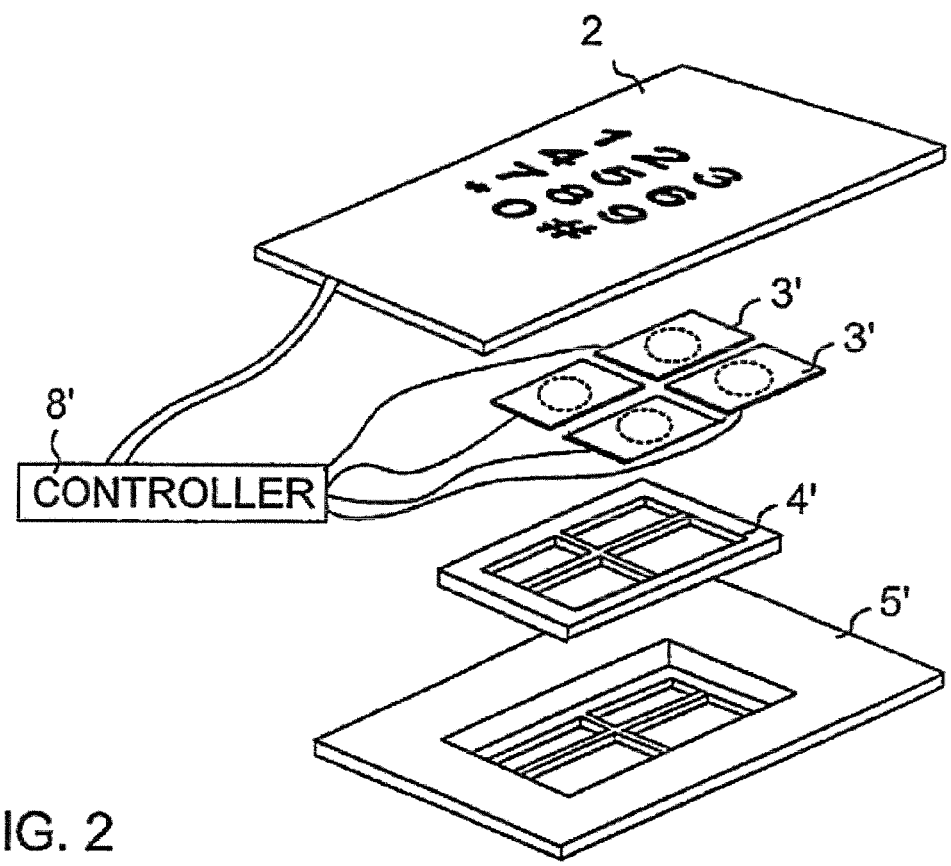
FIG. 2 shows a second preferred embodiment of an apparatus according to the invention.

FIG. 2 shows a second preferred embodiment of an apparatus according to the invention. FIG. 2 only shows parts of the apparatus associated with the keypad.

The keypad in the embodiment of FIG. 2 is very similar to the one shown in FIGS. 1*a* to 1*c*. The only differences are that the apparatus includes four piezoelectric elements 3' in the embodiment of FIG. 2, and that the soft foam frame 4' and the hard layer 5' have a slightly different shape in order to receive and support the four piezoelectric elements 3'.

Controller 8' is programmed in a slightly different manner than the corresponding controller in the embodiment of FIGS. 1*a* to 1*c*. The controller is thus capable of controlling the four different piezoelectric elements 3'.

The keys on the keypad 2 of FIG. 2 are divided into four groups, for instance. The controller 8' includes a memory wherein information is stored about which key belongs to which group. This memory also contains information about which piezoelectric element is located closest to each group of keys.

When a user presses a key on the keypad, the controller 8' identifies the pressed key. When the key has been identified, the controller checks to which group of keys the pressed key belongs, and after that, the controller further checks which piezoelectric element is located closest to the identified group of keys. This closest piezoelectric element is then controlled by the controller to generate tactile feedback to the user as explained in connection with FIGS. 1*a* to 1*c*. In this embodiment, the user of the apparatus feels vibration which only causes a region close to the pressed key to vibrate.

The other functions of the controller 8' are similar to those explained in connection with the embodiment of FIGS. 1*a* to 1*c*. A further advantage achieved by using several piezoelectric elements is that the alerting vibration signal can be much stronger than when only one piezoelectric element is used. It is also possible to modify the vibration alerting, for instance, by synchronizing the vibrations of the different piezoelectric elements.

Figure 3A:
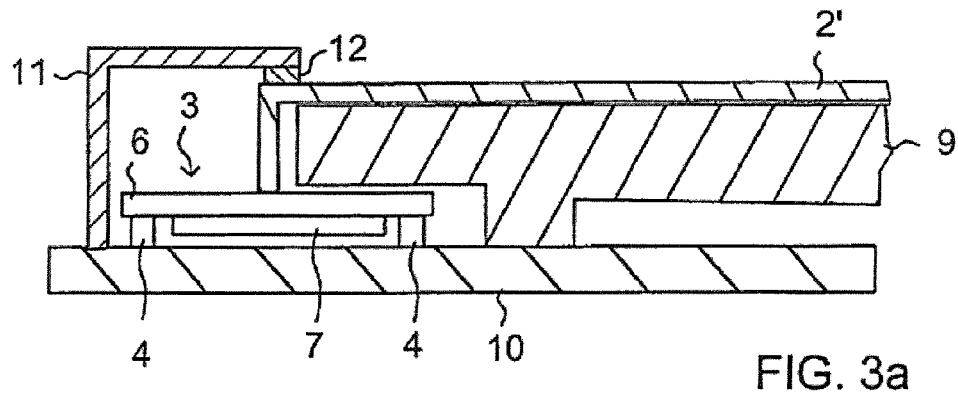
FIG. 3a shows a sectional view of a third preferred embodiment of an apparatus according to the invention.
Figure 3B:
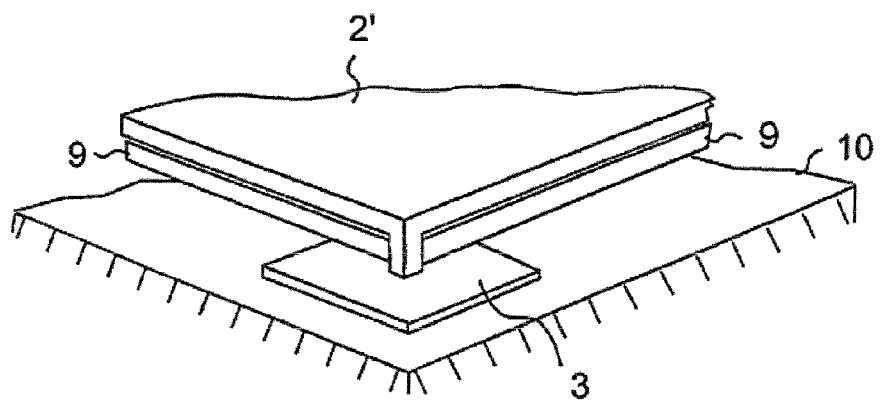
FIG. 3b shows a side view of some of the parts in FIG. 3a, FIG. 3c shows a top view of the parts in FIG. 3b, FIGS. 4a to 4f show different electrical waveforms fed to a piezoelectric element.

FIG. 3*a* shows a sectional view of a third preferred embodiment of an apparatus according to the invention. FIG. 3*b* shows a side view of some of the parts in FIG. 3*a*, and FIG. 3*c* shows a top view of the parts in FIG. 3*b*.

Figure 3C:
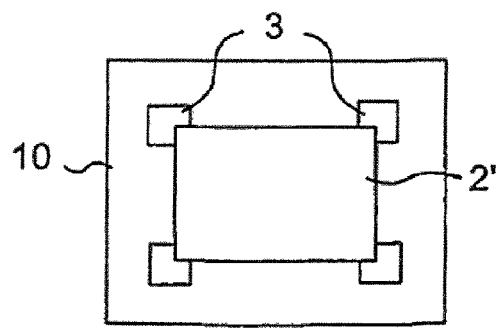

Only the parts of the apparatus which are associated with the keypad are shown in FIGS. 3*a* to 3*c*. The apparatus of FIGS. 3*a* to 3*c* is provided with a touch screen keypad, in other words a combination of a display and a keypad, where the user presses keys shown on the screen.

A touch-sensitive transparent cover 2' forms an upper surface of the touch screen keypad. Each corner of the rectangular cover 2' is supported by a piezoelectric element 3. The piezoelectric elements 3 are similar to those shown in FIGS. 1*a* to 1*c* and they are supported, for instance, by a Printed Circuit Board (PCB) 10 of the apparatus. A soft foam frame has, however, been arranged between the PCB 10 and the metal plate 6 of the piezoelectric elements 3.

The PCB 10 also supports a display circuit 9. This display can be used both to display information to the user of the apparatus and to display the numbers or letters of the "keys", which, in the embodiment of FIGS. 3*a* to 3*c*, consist of areas on the touch-sensitive cover 2'. The touch sensitive-cover is, in the example of FIGS. 3*a* to 3*c*, attached to the apparatus by means of a frame 11, which, via an elastic strip 12, keeps the support 2' in place, allowing it to vibrate, however.

Tactile feedback given to a user in connection with a keystroke is generated by one or more of the piezoelectric elements 3 generating vibration that causes the entire cover 2' to vibrate.

The piezoelectric elements can be controlled as explained in connection with FIGS. 1*a* to 1*c* to give tactile feedback which enables the user to determine whether or not the pressed key was available as an option, give a vibration alert in connection with an incoming call, and to give sound vibration in connection with an incoming call.

Figure 4A:
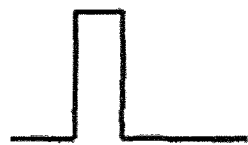
Figure 4B:
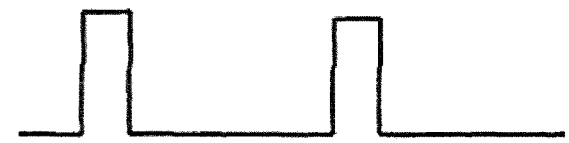
Figure 4C:
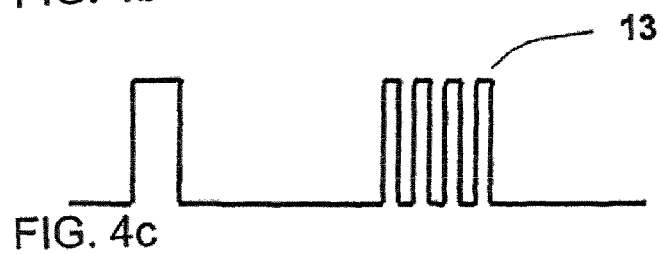

FIGS. 4*a* to 4*f* show examples of waveforms which can be fed to a piezoelectric element in connection with different tasks. FIG. 4*a* shows a regular key click. FIG. 4*b* shows a multiple click that can be used to indicate an error, for example. It can also indicate that a certain key or function has been activated, or that the nth key of an array of keys was pushed by clicking n times as verification, making visual verification unnecessary. Another kind of indication is depicted in FIG. 4*c*. Here rapid sequential clicks making a sound 13 is heard after the key click. This sound can comprise a complex group of pulses as will be described.

Figure 4D:
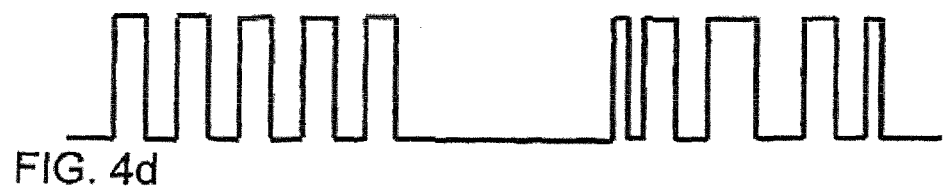

A waveform as depicted in FIG. 4*d* can be used to announce incoming calls in a telecommunications terminal. This waveform can be frequency modulated 14, making different alerting tones, even music, possible. The emitted sound can be a multichannel stereophonic sound if several separately controlled piezoelectric elements are available.

Figure 4E:
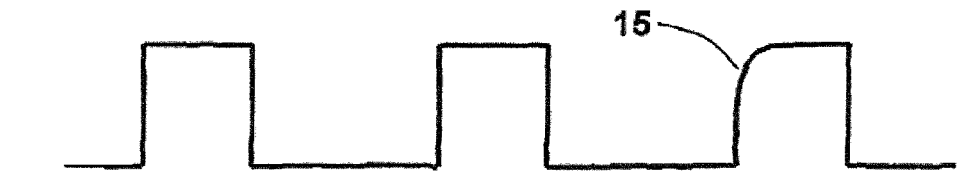
Figure 4F:
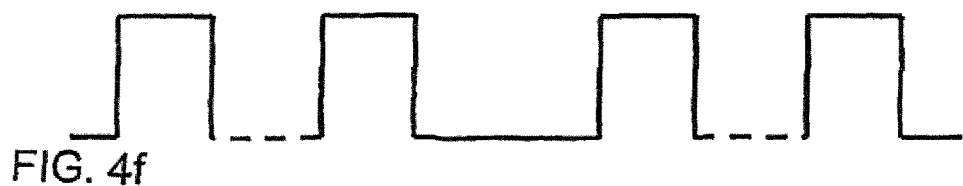

When a piezoelectric element is to be used to generate a vibrating alarm, the used frequency is lower and the audible sound is subdued. A way to achieve a more silent alarm is to make the leading edge of the waveform somewhat slanted. A typical simple vibration signal with this leading edge slant 15 is depicted in FIG. 4*e*. When needed, more complicated vibrational alerts can be generated in the same way as was described for the different keypress error signals. In FIG. 4*f* is depicted such a multiple vibrating alert, consisting of separate groups of vibrations. Although not shown, it is possible to use a non-slanted leading edge waveform if audible alerting is needed in addition to silent vibration alerting.

FIG. 5 shows an electric circuit with a piezoelectric element. The circuit of FIG. 5 can be used, for instance, in connection with the controller 8 shown in FIG. 1*b*.

In FIG. 5 the piezoelectric element 3 is controlled by the controller 8 using a switch 21 to control the current flow from the power supply 16. The power supply is only indicated, as it can be considered as known art to build a suitable power supply generating a voltage of 150 . . . 200 VDC with a current capability in the milliampere range from a low voltage source. The output voltage of such power supply can also relatively easily be arranged to be adjustable by a controller.

The power supply 16, as well as the controller 8, are both preferably powered from the same low voltage power supply 17, which typically is the battery of a portable terminal.

Each piezoelectric element is connected to at least one switch 21 controlled 22 by the controller 8 or contained in the controller. Each piezoelectric element can also be controlled by multiple switches and the controller can also independently control multiple piezoelectrical elements.

The controller 8 controls the operation of a piezoelectric element with the help of a switch. The switch 21 is typically a high-voltage transistor. The controller operates the switch to generate such waveforms over the piezoelectric element 3 that were depicted in FIG. 4.

In order to vary the leading edge of the waveform waveform and give it a slant, a variable serial resistor 19 can be inserted in the circuit. Only manual adjustment is shown in FIG. 5 in order to keep the example circuit simple.

The voltages acting on the piezoelectric element 3 are shown by way of examples in FIGS. 6a and 6b. To discharge the piezoelectric element 3 a bleeding resistor 20 is connected across the element. This resistor mainly affects the lagging edge 32 of the waveform over the element. Because it does not change the audible alerts or perceived vibrations amplitude as much as the serial resistor 18, it can advantageously be a fixed resistor.

The serial resistor 19 adjusts the level of the audible vibrations by changing the slant 31 of the leading edge, as indicated in FIG. 6a. It can be used to make the slow vibrational alerts inaudible.

In FIG. 6b is exemplified how the terminal voltage 30 decreases to the level indicated by 33 when the resistance of resistor 19 is increased to increase the slant of the leading edge 31 in order to make the vibration alert less audible. The capacitance of the piezoelectric element together with any serial resistor forms an RC circuit. The terminal voltage of this RC circuit decreases because it is dependent on the voltage divider formed by the serial resistor 19 and the bleeder resistor 20. The perceived vibrational alerting amplitude is depending on the terminal voltage 30, so the vibrational intensity decreases when the serial resistance is increased, but this can be compensated by increasing the level of the power supply voltage 18 to give the earlier terminal voltage over the element and thus give the user the same perceived vibration intensity.

Figure 7:
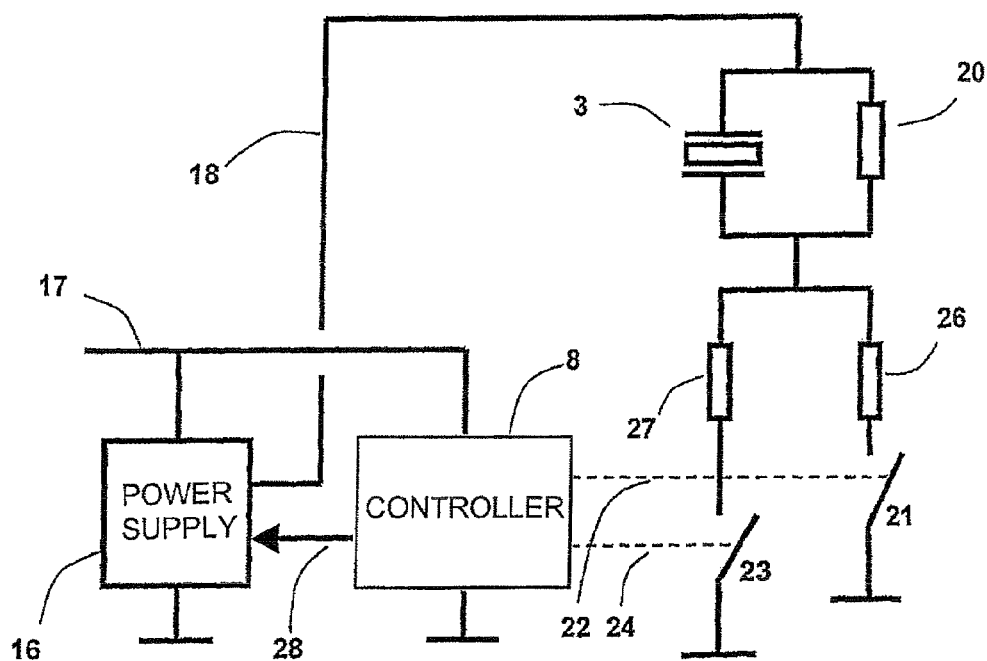
FIG. 7 shows another electric circuit with a piezoelectric element.

FIG. 7 shows another electric circuit with a piezoelectric element. The circuit of FIG. 7 can be used, for instance, in connection with the controller 8 shown in FIG. 1b.

In FIG. 7 is shown a circuit incorporating voltage control 28 by the controller 8. When the controller is operating 22, 24 the switches 21, 23 in various combinations to select various amounts of serial resistance, it simultaneously compensates by controlling 28 the power supply 16 to change the output voltage 18 in order to keep the terminal voltage acting on the piezoelectric element constant. The vibrational amplitude will thus stay constant regardless if the user wants sound or no sound with the vibration.

FIG. 7 depicts how the controller controls 22, 24 a single piezoelectric element 3 with the help of multiple switches 21, 23. The multiple resistors 26, 27 in FIG. 7 replaces the serial resistor 19 in FIG. 5. The parallel combinations of switched resistors can form a binary sequence of serial resistance or otherwise be of any suitable value for the application.

Although not shown, the controller 8 can independently control additional piezoelectric elements. Each independent element will have its own switch or switches separately controlled by the controller through additional control lines like the set of control lines 22, 24 depicted in FIG. 7. The possibility to control multiple elements separately in sequence can be used to enhance the vibrational tactile feeling experienced by the user.

It is to be understood that the above description and the accompanying drawings are only intended to illustrate the present invention. It should thus be understood that the invention is not restricted to be used only in connection with media terminals even though the invention has been explained by way of example in connection with media terminals. It will be obvious to those skilled in the art that the invention can be varied and modified also in other ways without departing from the scope and spirit of the invention disclosed in the attached claims.

What is claimed is:

1. An apparatus comprising:
    a touchscreen keypad;
    a plurality of piezoelectric elements, each configured to generate a vibration which is forwarded to a user of the apparatus via the touchscreen keypad; and
    a controller coupled to the touchscreen keypad and each of the plurality of piezoelectric elements, the controller configured to cause the apparatus to:
        detect the user pressing a selected key of the touchscreen keypad;
        determine a selected one of the plurality of piezoelectric elements that is closest to the selected key; and
        generate a tactile response via the selected piezoelectric element that causes only a region close to the selected key to vibrate, the region including the selected key.

2. The apparatus of claim 1, wherein the controller is further configured to cause the apparatus to generate two or more kinds of vibration by synchronizing vibrations of the plurality of piezoelectric elements.

3. The apparatus of claim 1, wherein the touchscreen keypad comprises a display circuit configured to display both user display information and keys of the keypad.

4. The apparatus of claim 1, wherein the controller is further configured to cause the apparatus to generate an alerting vibration independent of keypad events via at least one of the plurality of piezoelectric elements.

5. The apparatus of claim 1, wherein the controller is further configured to cause the apparatus to generate a sound via at least one of the plurality of piezoelectric elements.

6. A method comprising:
    detecting, via a controller, a user pressing a selected key of a touchscreen keypad, wherein the touchscreen keypad is coupled to a plurality of piezoelectric elements each configured to generate a vibration which is forwarded to the user via the touchscreen keypad;
    determining, via a controller, a selected one of the plurality of piezoelectric elements that is closest to the selected key; and
    generating a tactile response via the selected piezoelectric element that causes only a region close to the selected key to vibrate, the region including the selected key.

7. The method of claim 6, further comprising causing the apparatus to generate two or more kinds of vibration by synchronizing vibrations of the plurality of piezoelectric elements.

8. The method of claim 6, further comprising generating an alerting vibration independent of keypad events via at least one of the plurality of piezoelectric elements.

9. The method of claim 6, further comprising generating a sound via at least one of the plurality of piezoelectric elements.

10. An apparatus comprising:
    a programmable controller, and
    a memory,
    the programmable controller configured to be coupled to a touchscreen keypad and each of a plurality of piezoelectric elements, wherein the plurality of piezoelectric elements is each configured to generate a vibration which is forwarded to a user of the apparatus via the touchscreen keypad; and wherein the programmable controller, in cooperation with the memory, is programmed to cause the apparatus to:
        detect the user pressing a selected key of the touchscreen keypad;
        determine a selected one of the plurality of piezoelectric elements that is closest to the selected key; and generate a tactile response via the selected piezoelectric element that causes only a region close to the selected key to vibrate, the region including the selected key.

11. The apparatus of claim 10, wherein the programmable controller is further programmed to cause the apparatus to generate two or more kinds of vibration by synchronizing vibrations of the plurality of piezoelectric elements.

12. The apparatus of claim 10, wherein the programmable controller is further programmed to cause the apparatus to generate an alerting vibration independent of keypad events via at least one of the plurality of piezoelectric elements.

13. The apparatus of claim 10, wherein the programmable controller is further programmed to cause the apparatus to generate a sound via at least one of the plurality of piezoelectric elements.

* * * * *